United States Patent
Seelert et al.

(10) Patent No.: US 8,761,213 B2
(45) Date of Patent: Jun. 24, 2014

(54) WAVELENGTH-STABILIZED FREQUENCY-CONVERTED OPTICALLY PUMPED SEMICONDUCTOR LASER

(71) Applicant: Coherent GmbH, Göttingen (DE)

(72) Inventors: Wolf Seelert, Lübeck (DE); Vasiliy Ostroumov, Bad Schwartau (DE)

(73) Assignee: Coherent GmbH, Göttingen (DE)

( * ) Notice: Subject to any disclaimer, the term of this patent is extended or adjusted under 35 U.S.C. 154(b) by 19 days.

(21) Appl. No.: 13/632,372

(22) Filed: Oct. 1, 2012

(65) Prior Publication Data
US 2014/0092926 A1  Apr. 3, 2014

(51) Int. Cl.
| | |
|---|---|
| *H01S 3/10* | (2006.01) |
| *H01S 3/00* | (2006.01) |
| *H01S 3/02* | (2006.01) |
| *H01S 3/08* | (2006.01) |
| *H01S 3/09* | (2006.01) |
| *H01S 3/091* | (2006.01) |
| *H01S 3/093* | (2006.01) |
| *H01S 3/04* | (2006.01) |
| *H01S 3/102* | (2006.01) |

(52) U.S. Cl.
CPC ............... *H01S 3/0014* (2013.01); *H01S 3/00* (2013.01); *H01S 3/0078* (2013.01); *H01S 3/0092* (2013.01); *H01S 3/025* (2013.01); *H01S 3/08072* (2013.01); *H01S 3/09* (2013.01); *H01S 3/091* (2013.01); *H01S 3/093* (2013.01); *H01S 3/04* (2013.01); *H01S 3/1028* (2013.01)
USPC ............ 372/20; 372/22; 372/25; 372/29.014; 372/34

(58) Field of Classification Search
CPC ....... H01S 3/00; H01S 3/0014; H01S 3/0078; H01S 3/0092; H01S 3/025; H01S 3/08072; H01S 3/09; H01S 3/091; H01S 3/093; H01S 3/04
USPC .................... 372/20, 22, 29.014, 25
See application file for complete search history.

(56) References Cited

U.S. PATENT DOCUMENTS

| | | | | |
|---|---|---|---|---|
| 5,185,750 | A | * | 2/1993 | Kafka et al. ................ 372/18 |
| 6,097,742 | A | | 8/2000 | Caprara et al. |
| 6,160,825 | A | | 12/2000 | Konig |
| 8,400,574 | B2 | * | 3/2013 | Voigt et al. ................ 349/18 |
| 2002/0186726 | A1 | | 12/2002 | Ledentsov et al. |
| 2004/0022283 | A1 | * | 2/2004 | Kuznetsov et al. ......... 372/32 |

* cited by examiner

*Primary Examiner* — Dung Nguyen
(74) *Attorney, Agent, or Firm* — Morrison & Foerster LLP

(57) ABSTRACT

A frequency-doubled OPS-laser having a desired output wavelength of 532 nm is tunable about that wavelength by a temperature tuned birefringent filter (BRF). The temperature of the BRF is varied while measuring transmission of a sample of the output through a Nd:YAG crystal having an absorption peak at a wavelength of about 532.4 nm. The peak is detected as a minimum of transmission and the temperature at which that minimum occurs is recorded. From wavelength-change-versus-temperature data for the BRF a temperature is calculated at which the output wavelength has the desired value and is maintained at that value to stabilize the output wavelength.

9 Claims, 3 Drawing Sheets

WAVELENGTH-STABILIZED FREQUENCY-CONVERTED OPTICALLY PUMPED SEMICONDUCTOR LASER

TECHNICAL FIELD OF THE INVENTION

The present invention relates in general to surface emitting, external cavity, optically pumped semiconductor lasers (OPS-lasers). The invention relates in particular to OPS-lasers wherein a fundamental wavelength of the lasers is frequency-converted to provide ultraviolet (UV) radiation.

DISCUSSION OF BACKGROUND ART

Inspection of processed (circuit covered) semiconductor wafers is commonly carried out in an apparatus wherein illumination is provided by a high-quality beam of UV laser radiation. The combination of the high beam-quality and the (short) UV wavelength allow for a tight focusing of the laser beam on the wafer for providing inspection with high-resolution.

A commonly used laser for providing the laser-radiation beam is frequency-converted solid-state laser using a neodymium-doped (Nd-doped) crystal gain-medium such as neodymium-doped yttrium aluminum garnet (Nd:YAG) or neodymium-doped yttrium orthovanadate (Nd:YVO$_4$). Such Nd-doped gain-media have a fundamental emission wavelength at about 1064 nanometers (nm). In order to provide radiation having a wavelength of about 266 nm, this fundamental wavelength is first frequency-doubled in first optically nonlinear crystal to provide radiation having a wavelength of about 532 nm. The 532 nm-radiation is then frequency-doubled in a second optically nonlinear crystal to provide the 266 nm-radiation.

A high quality multi-element telescope for focusing ultraviolet radiation at wavelengths less than 300 nm can, practically, only include elements made from selected high grade fused silica or fluorides. This means that chromatic correction of the telescope (to the precision required of the inspection apparatus) over a useful band of wavelengths is practically not possible. Accordingly, the lens is corrected for only one wavelength, i.e., the frequency converted UV wavelength of the solid-state laser. Because of the tightness of focus required the UV laser wavelength must be within about ±0.05 nm of the wavelength for which the lens is corrected.

An advantage of the frequency converted solid-state laser in this regard is that the fundamental wavelength, and accordingly the frequency-converted wavelength, results from a very-narrow emission band of the gain-medium. The center wavelength of this band is essentially invariable over a normal range of operating conditions and environments of the laser, and does not change with operating time of the laser.

An attractive alternative to a frequency-converted solid-state laser, at least from the point of view of continuous wave (CW) output power, beam-quality, and cost, is a frequency-converted OPS-laser. Intra cavity frequency-doubled CW OPS-lasers with single-mode output of over 10 Watts (W) at green wavelengths are now commercially available. External doubling can convert this green output to UV.

An OPS-laser employs a multilayer semiconductor gain-structure including active layers separated by pump-radiation absorbing spacer layers. The gain-structure surmounts a mirror structure that provides one mirror of a laser resonator, either fully reflecting end-mirror or a fully reflecting fold-mirror. The fundamental wavelength of the gain-structure can be varied by varying the composition of the active layers. A detailed description of high-power CW OPS-lasers, both fundamental and frequency-converted, is provided in U.S. Pat. No. 6,097,742, assigned to the assignee of the present invention, and the complete disclosure of which is hereby incorporated herein by reference.

The OPS gain-structure has a relatively wide gain-bandwidth, for example about 30 nm around a center wavelength of about 1000 nm. Typically, a birefringent filter (BRF) is located in the resonator to select an oscillating wavelength from the gain-bandwidth. In the case of an intra-cavity frequency-doubled OPS-laser, this serves also to keep the oscillating wavelength within the acceptance bandwidth of the optically nonlinear crystal used for the frequency doubling.

While stability of the output wavelength of an OPS-laser is adequate for most applications, subtle variations in the OPS gain-structure, and the BRF, with environmental conditions or aging are such that control to an absolute wavelength within the above-discussed ±0.05 nm requirement for high precision wafer inspection at hard UV wavelengths cannot be guaranteed. If OPS-lasers are to be substituted for solid-state lasers in this application, a remedy for this wavelength-stability shortcoming is necessary.

SUMMARY OF THE INVENTION

The present invention is directed to a method of operating an intra-cavity frequency-doubled OPS-laser resonator to provide radiation having a desired second-harmonic output wavelength. The laser resonator includes a multilayer semiconductor gain-medium having a characteristic gain-bandwidth and energized by optical pump radiation for causing radiation having a fundamental wavelength to circulate in the laser resonator. The laser-resonator has a temperature-tunable birefringent filter therein for selecting the fundamental wavelength of the circulating radiation from within the gain-bandwidth. The laser-resonator has an optically nonlinear crystal therein arranged to frequency-double the circulating fundamental-wavelength radiation to provide second-harmonic radiation having a wavelength one-half that of the fundamental radiation. The resonator is configured to deliver the second-harmonic radiation as output. In one aspect, the method comprises calibrating the change of transmission wavelength as a function of temperature for the birefringent filter. The second-harmonic output radiation is sampled and directed through a rare-earth doped crystal medium having an absorption-peak wavelength within a harmonic gain bandwidth centered on a wavelength one half of the fundamental wavelength of the semiconductor gain-medium. By varying the temperature of the birefringent filter, the second-harmonic wavelength is varied through a range of wavelengths including the peak-absorption wavelength while measuring transmission of the second-harmonic wavelength sample through the rare-earth doped crystal medium until a transmission minimum is detected at the peak absorption wavelength. The temperature at which the transmission minimum is detected is recorded. From the birefringent filter calibration, and the recorded temperature a temperature at which the birefringent filter must be set to provide the desired second-harmonic output wavelength is calculated. The birefringent filter is maintained at the calculated temperature to stabilize the second-harmonic output wavelength.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
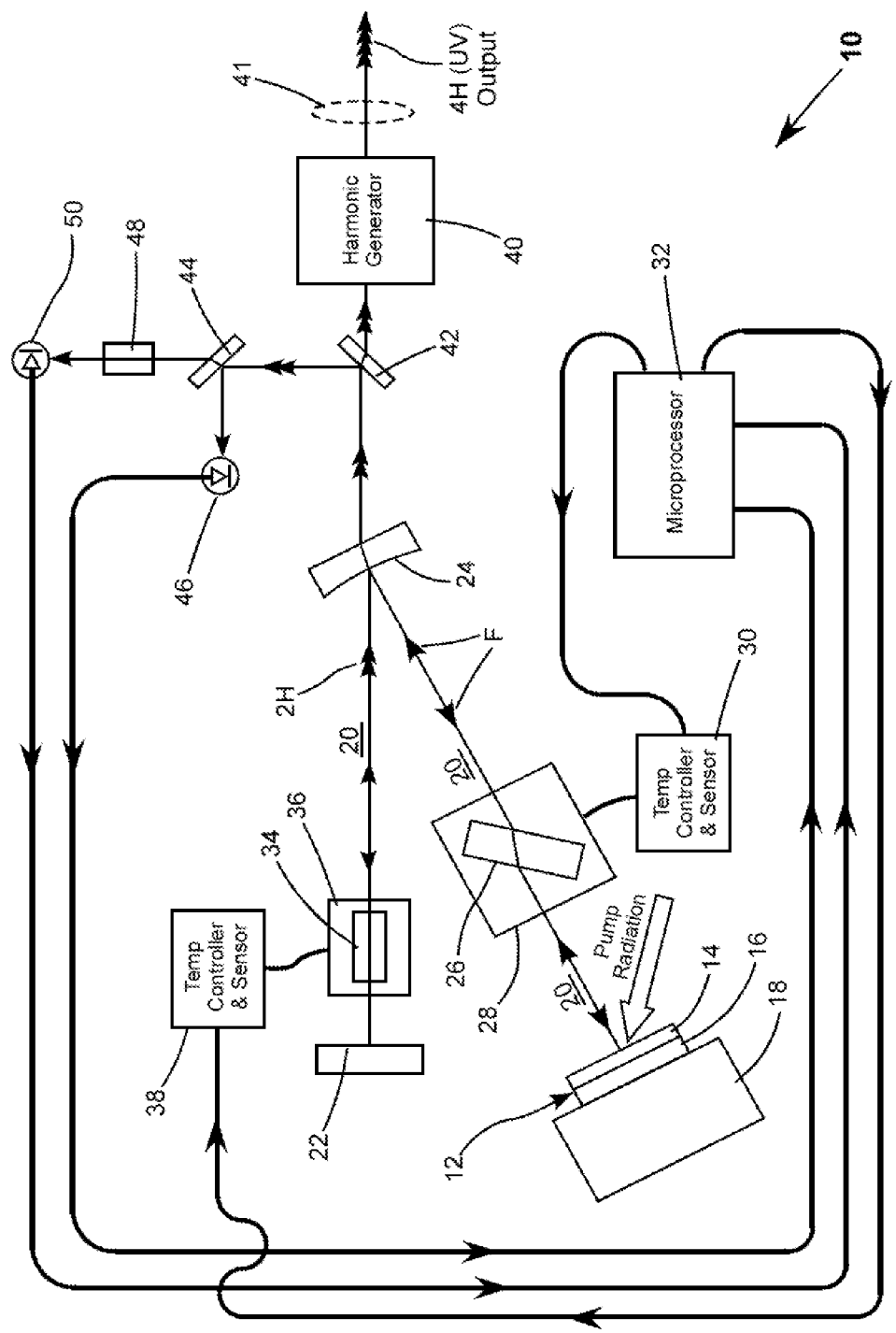
FIG. 1 schematically illustrates a frequency-converted OPS-laser in accordance with the present invention that includes a temperature-tuned birefringent filter cooperative with a wavelength-reference element in the form of a short length of Nd:YAG crystal.

Referring now to the drawings, wherein like components are designated by like reference numerals, FIG. 1 schematically illustrates a preferred embodiment 10 of a frequency-converted, CW, OPS-laser in accordance with the present invention. In the drawing, optical paths are depicted by fine lines and electrical connections are depicted by bold lines.

Laser 10 includes an OPS-structure (OPS-chip) 12 having a multilayer semiconductor gain structure 14 surmounting a mirror structure 16. OPS-chip 12 is bonded to a heat sink 18. The gain-structure of the OPS-chip is energized by pump radiation form a diode-laser array (not shown). Fundamental-wavelength radiation circulates in the resonator as indicated by arrowheads F. In this example where the desired fundamental wavelength is about 1064 nm, one possible material for active layers of the gain-structure is indium gallium arsenide phosphide (InGaAsP).

A laser resonator 20 is formed between minor-structure 16 of the OPS-chip and a plane mirror 22. Mirror structure 16 and mirror 22 are each highly reflective at the selected fundamental wavelength of the gain-structure. Resonator 20 is folded by a fold mirror 24, which is highly reflective at the fundamental wavelength, and highly transmissive at the second-harmonic wavelength of the fundamental wavelength.

Located in the resonator between the OPS-chip and mirror 24 is a BRF 26 configured to select the fundamental wavelength from the gain-bandwidth of the gain-structure. The transmission wavelength of the BRF is temperature sensitive. This allows fine tuning of the BRF to be accomplished through a heating plate 28 responsive to a temperature sensor and controller 30, responsive in turn to instructions from a microprocessor 32. By way of example a quartz-crystal BRF which produces twenty full-wave polarization-rotations has a variation of peak transmission with temperature of about 0.1 nm/K around 1064 nm. With available temperature control of about ±10 mK, this provides that fundamental wavelength control up to about ±0.001 nm or ±1 picometer (pm), which translates to about ±0.5 pm at the second-harmonic wavelength.

An optically nonlinear crystal 34 is located in resonator 20 between minors 22 and 24. This crystal converts circulating fundamental radiation to second-harmonic radiation in a double pass through the crystal. The second-harmonic radiation (2H-radiation), having a wavelength of about 532 nm in this example, is indicated in FIG. 1 by double arrowheads 2H. Crystal 34 is heated by a heating plate 36 and maintained at a predetermined phase-matching temperature by a temperature sensor and controller 38 responsive to microprocessor 32.

The second-harmonic radiation is delivered to a harmonic generator 40. Harmonic generator 40 includes an optically nonlinear crystal (not shown) which converts the 2H-radiation to fourth-harmonic (4H) radiation by further frequency-doubling. Preferably the crystal is located a ring-resonator which is actively phase-locked for enhancing the harmonic conversion, as is known in the art. In one preferred embodiment, the 4H output of the harmonic generator 40 is supplied to a lens system 41 for focusing the beam on a workpiece.

A partially reflective filter 42 directs a portion of the 2H (~532 nm) radiation to a beam-splitter 44 which reflects one part of the 2H radiation portion to a photo-diode detector 46. Beam-splitter 44 transmits another part of the 2H radiation portion, via transmission through a Nd-YAG crystal 48 to another photo-diode detector 50. Output (signals) from photo-diodes 46 and 50 are transmitted to microprocessor 32 which interprets the ratio of the signals as a measure of transmission through the crystal 48. Here the output from detector 46 acts as a reference. Scanning the fundamental (and 2H) wavelength by varying the temperature of BRF 26 while measuring transmission through the Nd:YAG crystal 48 allows a particular absorption peak of the Nd:YAG crystal to be located at a known temperature. With a calibrated change of wavelength with temperature of the BRF, a temperature of the BRF can be selected and maintained to stabilize the 2H wavelength and accordingly the 4H wavelength at a known absolute value. This is explained in further detail below with reference to FIG. 2, FIG. 3 and FIG. 4.

Figure 2:
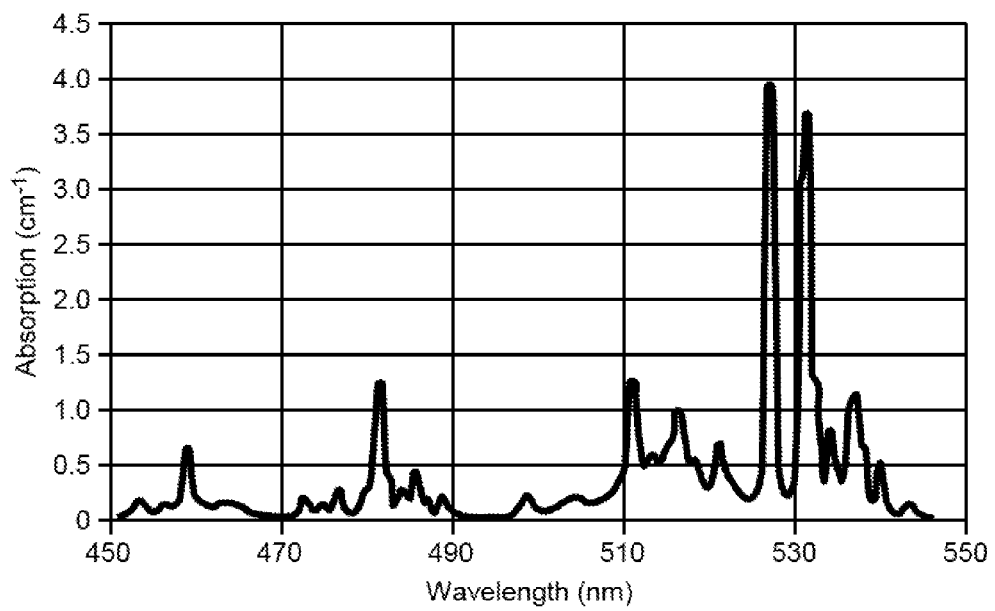
FIG. 2 is a graph schematically illustrating measured absorption as a function of wavelength of a Nd:YAG crystal including a cluster of absorption peaks around the second-harmonic (532 nm) of the 1064 nm emission wavelength of the crystal.

FIG. 2 is a graph schematically illustrating measured absorption as a function of wavelength of a Nd:YAG crystal having a doping percentage of 10% and a length of 10.17 mm. This graph is on a relatively coarse wavelength scale between 450 nm and 550 nm. Nevertheless it can be seen that there a cluster of absorption peaks generally around the second-harmonic (532 nm) of the 1064 nm emission wavelength of the crystal. In this example that is the desired wavelength for the 2H radiation corresponding to the 2H wavelength of a frequency doubled Nd:YAG laser.

Figure 3:
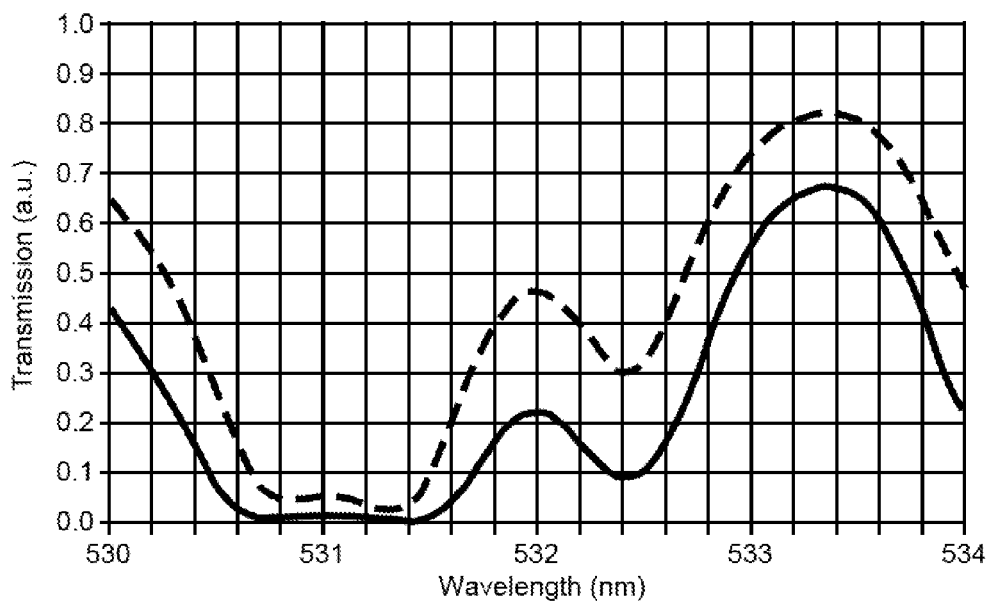
FIG. 3 is a graph schematically illustrating measured transmission as a function of wavelength for two different lengths of the Nd:YAG crystal of FIG. 2 in wavelength range between 530 nm and 534 nm.

FIG. 3 is a graph schematically illustrating measured transmission as a function of wavelength for two different lengths of the Nd:YAG crystal of FIG. 2 in wavelength range between 530 nm and 534 nm. The solid curve is for a crystal having a length of 20.17 mm and the dashed curve is for a crystal having a length of 10.17 mm. Here the 20.17 mm length is preferred and an absorption peak of particular interest is evidenced by the transmission minimum at about 532.4 nm. These absorption peaks have negligible temperature dependence for temperatures at which the inventive OPS-laser will operate.

Figure 4:
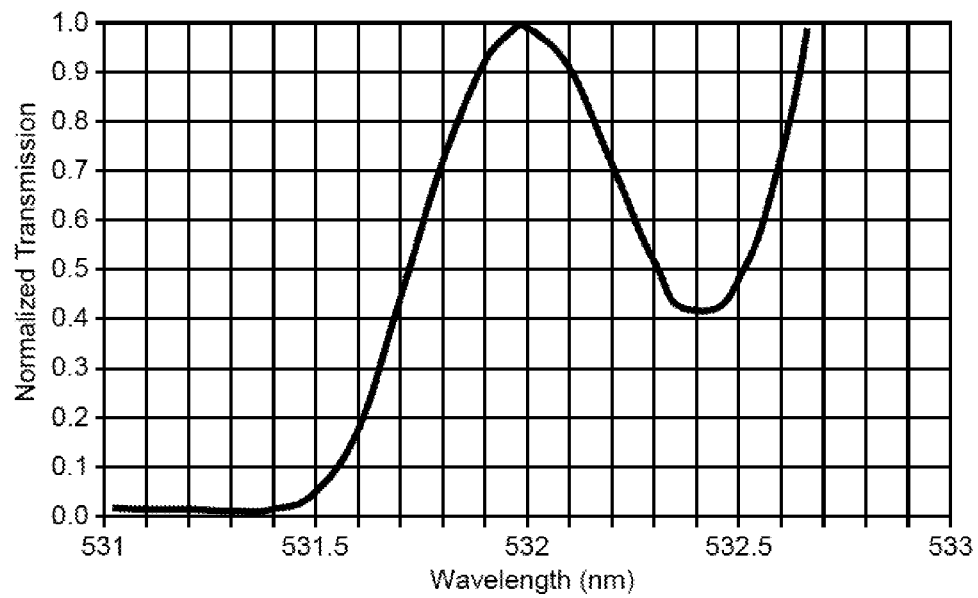
FIG. 4 is a graph schematically illustrating normalized transmission as a function of wavelength for the longer length of Nd:YAG crystal of the graph of FIG. 3 in a wavelength range between 531 nm and 533 nm.

FIG. 4 is a graph schematically illustrating normalized transmission as a function of wavelength for the 20.17 mm length of the Nd:YAG crystal of the graph of FIG. 3 in a wavelength range between 531 nm and 533 nm. This indicates that the local minimum at 523.4 nm and the local maximum at 532 nm are readily detectable by microprocessor 32, from the ratio of the signals from photo-diodes 50 and 46. A description of one preferred mode of operation of the inventive laser is set forth below preferred mode of operation for operating the laser at a stabilized absolute wavelength is set forth below with continuing reference to FIG. 4 and reference again to FIG. 1.

The BRF transmission wavelength as a function of temperature and the wavelength change as a function of temperature (dλ/dT) is stored in microprocessor 32. The transmission wavelength is initially set by the microprocessor, through temperature control of the BRF at some wavelength detuned from the absorption line of Nd:YAG to be detected, here 532.4 nm, by about 2 nm. Because of the relatively broad gain-bandwidth of the OPS-gain structure, this detuning range is possible without significant power variation. The microprocessor then scans the BRF transmission wavelength (by scanning the temperature) to determine the temperature at which the local minimum is detected from the photo-diode signals. The detuning range can be considered as being within a harmonic gain-bandwidth which is half as wide as the fundamental gain-bandwidth and centered on a wavelength one-half of the fundamental wavelength.

The microprocessor then has a record of what BRF temperature provides an absolute 532.4 nm wavelength. From the stored wavelength-change as a function of temperature data and the recorded 532.4 nm temperature, the microprocessor sets the temperature controller to hold the BRF at a temperature which will maintain the laser wavelength at the desired value, at which it will remain, within a few picometers, during even elongated operating periods of the laser.

The above wavelength-setting routine can be repeated every time the laser is started from an inoperative period. The transmission-wavelength as a function of indicated temperature of the BRF can be periodically recalculated to avoid error due to drift or aging of the temperature controller or the sensor. A convenient means of calibration is to scan through the absorption minimum (transmission maximum) at 532 nm and the absorption maximum (transmission minimum) at 532.4 nm with the microprocessor recording the temperature at which each is detected.

Figure 5:
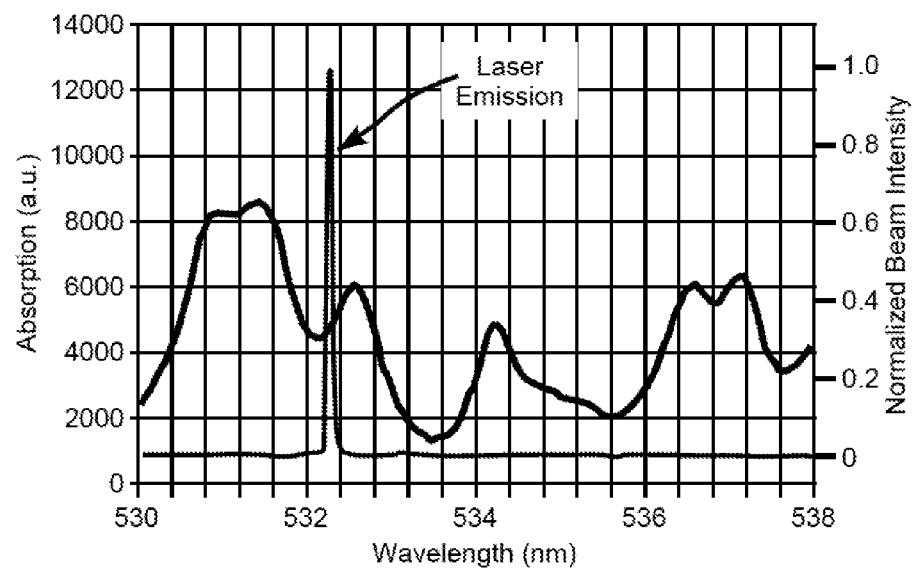
FIG. 5 is a graph schematically illustrating measured absorption as a function of wavelength for a Nd:YAG crystal in an example of the laser of FIG. 1 with a laser emission spectrum superimposed.

FIG. 5 is a graph schematically illustrating measured absorption as a function of wavelength (absorption spectrum) for a Nd:YAG crystal in an example of the laser of FIG. 1. Superimposed is an emission spectrum of the laser output locked to a wavelength shorter than 532.4.

It should be noted that while the present invention is described above in terms substituting a frequency-converted OPS-laser for a frequency-converted solid-state laser in 266 nm wafer inspection apparatus, similar wavelength precision would be required were an OPS-laser used in conjunction with a solid-state amplifier, to ensure that the OPS-laser output wavelength matched the narrow fixed gain bandwidth of the solid-state gain medium.

In the exemplary case, it is of great convenience that the very solid-state medium being replaced by OPS-gain structure has a rich, crowded absorption structure, near the second-harmonic wavelength of the solid-state gain-medium. For other operating wavelengths it may be necessary to investigate the absorption structure of a range of crystal materials, doped with Nd or one or more other rare-earth elements, in order to find a material that exhibits an absorption-peak sufficiently close (within a practical tuning range of the OPS-laser) to the operating wavelength or a harmonic thereof that the inventive method can be practiced.

In summary the present invention is described above in terms of a preferred embodiment and suggested other embodiments. The invention is not limited, however, to the embodiments described, depicted, or suggested. Rather, the invention is limited only by the claims appended hereto.

What is claimed is:

1. A method of operating a laser having gain bandwidth larger than 10 nm to generate an output to having a wavelength within narrow bandwidth of less than 0.1 nm, said laser including a temperature tunable birefringent filter, said method comprising the steps of:
   directing a portion of the output from the laser into a solid state gain medium having a known absorption peak near a desired operating wavelength;
   monitoring an intensity of a light transmitted by the solid state gain medium; and
   adjusting the temperature of the birefringent filter based on the intensity measurements.

2. A method as recited in claim 1 wherein the temperature of the birefringent filter is adjusted while the intensity of the transmitted light is being monitored to locate the known absorption peak.

3. A methods recited in claim 2 wherein the temperature of the birefringent filter is set based on the temperature associated with the known absorption peak.

4. A method as recited in claim 1 further including the step of monitoring the intensity of the light generated by the laser and using that value as a reference to the monitored intensity of the light transmitted by the solid state gain medium.

5. A method as recited in claim 1 wherein the laser is a frequency doubled optically pumped semiconductor laser and the solid state gain medium is a neodymium doped crystal.

6. A laser comprising:
   an optical resonator;
   a gain medium located within the resonator;
   means for exciting the gain medium to generate a laser beam that exits the resonator;
   a birefringent filter within the resonator;
   means for varying a temperature of the birefringent filter;
   a solid state gain crystal located externally of the resonator, said solid state gain crystal having known absorption peak near a desired operating wavelength of the laser;
   a first detector of measuring an intensity of a portion of the laser beam after the beam exits the laser and has been transmitted through the solid state gain crystal and generating first output signals corresponding thereto; and
   a processor for receiving the first output signals from the detector and controlling the means for varying the temperature of the birefringent filter, said processor operating to calibrate the laser by varying the temperature of the birefringent filter and monitoring the first output signals from the detector to determine the temperature of the birefringent filter associated with the absorption peak of the gain crystal and thereafter setting the temperature of the birefringent filter to correspond to the desired output wavelength based on the calibration.

7. A laser as recited in claim 6 wherein said gain medium is an optically pumped, multilayer semiconductor and wherein the resonator further includes an optically nonlinear crystal for frequency doubling the fundamental radiation and the solid state gain crystal is doped with neodymium.

8. A laser as recited in claim 6 wherein the gain medium has a gain bandwidth larger than 10 nm.

9. A laser as recited in claim 6 further including a second detector for monitoring the output of a portion of the laser beam that exits the laser and that is not transmitted through the solid state gain crystal and generating second output signals corresponding thereto and wherein said processor utilizes the second output signals as a reference value for comparison to the first output signals.

* * * * *